(12) United States Patent
Sreenivasan et al.

(10) Patent No.: US 8,529,778 B2
(45) Date of Patent: Sep. 10, 2013

(54) LARGE AREA PATTERNING OF NANO-SIZED SHAPES

(75) Inventors: Sidlgata V. Sreenivasan, Austin, TX (US); Shuqiang Yang, Austin, TX (US); Frank Y. Xu, Round Rock, TX (US); Dwayne L. LaBrake, Cedar Park, TX (US)

(73) Assignees: Molecular Imprints, Inc., Austin, TX (US); Board of Regents, The University of Texas System, Austin, TX (US)

( * ) Notice: Subject to any disclaimer, the term of this patent is extended or adjusted under 35 U.S.C. 154(b) by 645 days.

(21) Appl. No.: 12/616,896

(22) Filed: Nov. 12, 2009

(65) Prior Publication Data
US 2010/0120251 A1 May 13, 2010

Related U.S. Application Data

(60) Provisional application No. 61/114,239, filed on Nov. 13, 2008.

(51) Int. Cl.
*B44C 1/22* (2006.01)

(52) U.S. Cl.
USPC .......... 216/47; 216/11; 216/41; 216/42; 216/45; 216/49; 216/51; 216/54; 216/56; 216/58; 438/689; 438/690; 438/691; 438/692; 438/700; 977/887; 977/888

(58) Field of Classification Search
None
See application file for complete search history.

(56) References Cited

U.S. PATENT DOCUMENTS

| | | | |
|---|---|---|---|
| 6,696,220 B2 | 2/2004 | Bailey et al. |
| 6,900,881 B2 | 5/2005 | Sreenivasan et al. |
| 6,916,584 B2 | 7/2005 | Sreenivasan et al. |
| 6,919,152 B2 | 7/2005 | Sreenivasan et al. |
| 6,986,975 B2 | 1/2006 | Sreenivasan et al. |
| 7,027,156 B2 | 4/2006 | Watts et al. |
| 7,037,639 B2 | 5/2006 | Voisin |
| 7,070,405 B2 | 7/2006 | Sreenivasan et al. |
| 7,077,992 B2 | 7/2006 | Sreenivasan et al. |
| 7,136,150 B2 | 11/2006 | Sreenivasan et al. |
| 7,186,656 B2 | 3/2007 | Sreenivasan |
| 7,229,273 B2 | 6/2007 | Bailey et al. |
| 7,252,777 B2 | 8/2007 | Vidusek et al. |
| 7,261,831 B2 | 8/2007 | Sreenivasan |
| 7,281,921 B2 | 10/2007 | Watts et al. |
| 7,309,225 B2 | 12/2007 | McMackin et al. |

(Continued)

FOREIGN PATENT DOCUMENTS

| | | |
|---|---|---|
| EP | 1860501 | 11/2007 |
| TW | 200809921 | 2/2007 |
| WO | WO/2008/060266 | 5/2008 |

OTHER PUBLICATIONS

E. Thompson et al., Proceedings of SPIE, vol. 5037, 2003, pp. 1019-1028.*

(Continued)

*Primary Examiner* — Lan Vinh
*Assistant Examiner* — Jiong-Ping Lu
(74) *Attorney, Agent, or Firm* — Cameron A. King

(57) ABSTRACT

Methods for creating nano-shaped patterns are described. This approach may be used to directly pattern substrates and/or create imprint lithography molds that may be subsequently used to directly replicate nano-shaped patterns into other substrates in a high throughput process.

18 Claims, 11 Drawing Sheets

(56) References Cited

U.S. PATENT DOCUMENTS

| | | |
|---|---|---|
| 7,699,598 B2 | 4/2010 | Sreenivasan et al. |
| 7,759,253 B2 | 7/2010 | Chang |
| 7,780,893 B2 | 8/2010 | Sreenivasan et al. |
| 7,785,526 B2 | 8/2010 | Voisin |
| 2003/0189273 A1 | 10/2003 | Olsson |
| 2004/0065976 A1* | 4/2004 | Sreenivasan et al. ...... 264/171.1 |
| 2004/0188381 A1 | 9/2004 | Sreenivasan |
| 2005/0064344 A1 | 3/2005 | Bailey et al. |
| 2005/0084804 A1 | 4/2005 | Truskett et al. |
| 2005/0189676 A1 | 9/2005 | Sreenivasan |
| 2005/0230882 A1 | 10/2005 | Watts et al. |
| 2005/0260848 A1 | 11/2005 | Sreenivasan |
| 2006/0063277 A1 | 3/2006 | Vidusek et al. |
| 2006/0113697 A1 | 6/2006 | Sreenivasan |
| 2007/0212494 A1 | 9/2007 | Xu et al. |
| 2007/0231981 A1 | 10/2007 | Sreenivasan et al. |
| 2008/0095878 A1 | 4/2008 | Bailey et al. |
| 2008/0118872 A1* | 5/2008 | Sreenivasan ................. 430/323 |
| 2009/0029191 A1* | 1/2009 | Albrecht ...................... 428/848 |
| 2009/0078673 A1* | 3/2009 | Kihara et al. .................. 216/11 |
| 2009/0130598 A1 | 5/2009 | Schmid et al. |
| 2009/0166933 A1 | 7/2009 | Sreenivasan |
| 2009/0212012 A1 | 8/2009 | Brooks et al. |
| 2009/0308837 A1* | 12/2009 | Albrecht et al. ................ 216/22 |
| 2010/0015270 A1 | 1/2010 | Choi et al. |
| 2010/0095862 A1 | 4/2010 | Miller et al. |
| 2010/0102029 A1 | 4/2010 | Schmid et al. |
| 2010/0109194 A1 | 5/2010 | Miller et al. |

OTHER PUBLICATIONS

J.J. Guo, J. Phys. D: Appl. Phys., vol. 37, 2004, pp. R123-R141.*
European Patent Office, Office Action pursuant to Article 94(3) in application No. 09756590.7, year 2012.

* cited by examiner

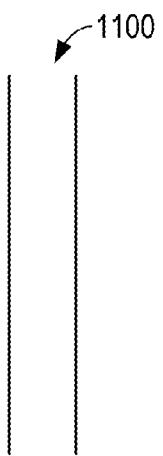 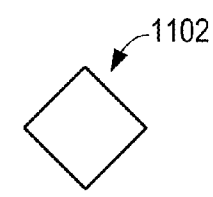 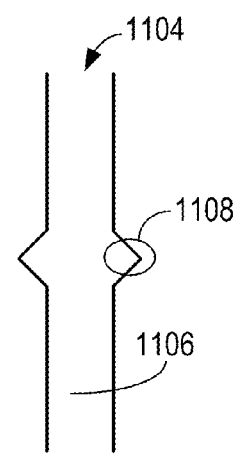
*FIG. 12A*  *FIG. 12B*  *FIG. 12C*

LARGE AREA PATTERNING OF NANO-SIZED SHAPES

CROSS-REFERENCE TO RELATED APPLICATION

This application claims the benefit under 35 U.S.C. §119 (e)(1) of U.S. Provisional Patent Application Ser. No. 61/114,239 filed Nov. 13, 2008, which is hereby incorporated by reference herein in its entirety.

BACKGROUND

Nano-fabrication involves the fabrication of very small structures, e.g., having features on the order of 100 nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, energy systems and the like.

An exemplary nano-fabrication technique is referred to as imprint lithography. Exemplary imprint lithography processes are described in detail in numerous publications, such as United States patent application publication 2004/0065976, United States patent application publication 2004/0065252, and U.S. Pat. No. 6,936,194, all of which are assigned to an assignee of the present invention.

An imprint lithography technique disclosed in each of the aforementioned United States patent application publications and United States patent includes formation of a relief pattern in a formable liquid (polymerizable layer) and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

Many nano-patterning applications take advantage of the size and uniform shape of nano-scale features to achieve a desired result. Many processes employed to make nano-patterns use a "growth" process to grow a particular type and size of nano-patterns. Unfortunately, these types of processes may be slow and prone to producing nano-patterns whose size and shape may be insufficiently controlled to produce desired performance cost effectively.

DESCRIPTION OF THE DRAWINGS

FIGS. 12A-12C illustrate a top down view of an exemplary first pattern, an exemplary second pattern, and an exemplary patterned surface formed by the first pattern and the second pattern.

DETAILED DESCRIPTION

Figure 1:
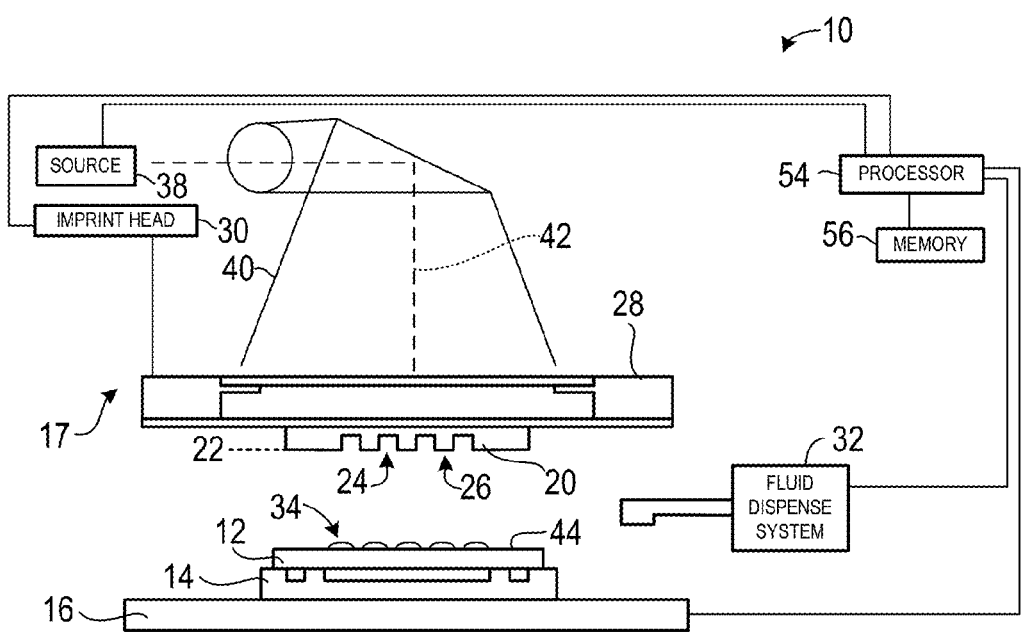
FIG. 1 illustrates a system suitable to form a relief pattern on a substrate according to embodiments herein.

Referring to FIG. 1, a system 10 to form a relief pattern on a substrate 12 is shown. Substrate 12 may be coupled to a substrate chuck 14. As shown substrate chuck 14 is a vacuum chuck, however, substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, stage 16, substrate 12, and substrate chuck 14 may be positioned on a base (not shown). Stage 16 may provide motion along the x, y, and z axes.

Spaced-apart from substrate 12 is a master patterning device 17. Master patterning device 17 comprises a template 28 having a mesa 20 extending therefrom towards substrate 12 with a patterning surface 22 thereon. Further, mesa 20 may be referred to as a mold 20. Mesa 20 may also be referred to as a nano-imprint mold 20. In a further embodiment, template 28 may be substantially absent of mold 20. In still a further embodiment, mold 20 may be integrally formed with template 28. Template 28 and/or mold 20 may be formed from such materials including, but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12. Master patterning device 17 may be formed employing electron beam (e-beam) lithography.

Master patterning device 17 may be coupled to a chuck 28, chuck 28 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes." Further, chuck 28 may be coupled to an imprint head 30 to facilitate movement of master patterning device 17.

System 10 further comprises a fluid dispense system 32. Fluid dispense system 32 may be in fluid communication with substrate 12 so as to deposit polymerizable material 34 thereon. System 10 may comprise any number of fluid dispensers, and fluid dispense system 32 may comprise a plurality of dispensing units therein. Polymerizable material 34 may be positioned upon substrate 12 using any known technique, e.g., drop dispense, spin-coating, dip coating, chemical vapor deposition (CVD), physical vapor deposition (PVD), thin film deposition, thick film deposition, and the like. Typically, polymerizable material 34 is disposed upon substrate 12 before the desired volume is defined between mold 20 and substrate 12. However, polymerizable material 34 may fill the volume after the desired volume has been obtained.

Polymerizable material 34 may comprise a solvent based monomer or a spin-on material. Further, polymerizable material 34 may comprise a monomer mixture as described in U.S. Pat. No. 7,157,036 entitled "Method to Reduce Adhesion Between a Conformable Region and a Pattern of a Mold" and United States patent application publication 2005/0187339 entitled "Materials for Imprint Lithography," both of which are incorporated herein by reference.

System 10 further comprises a source 38 of energy 40 coupled to direct energy 40 along a path 42. Imprint head 30 and stage 16 are configured to arrange master patterning device 17 and substrate 12, respectively, to be in superimposition and disposed in path 42. System 10 may be regulated by a processor 54 that is in data communication with stage 16, imprint head 30, fluid dispense system 32, and source 38, operating on a computer readable program stored in memory 56.

The above-mentioned system and process may be further employed in imprint lithography processes and systems referred to in U.S. Pat. Nos. 6,932,934, 7,077,992, 6,900,881, United States patent application publication 2004/0124566, United States patent application publication 2004/0188381, and United States patent application publication 2004/0211754, all of which are incorporated by reference herein. In a further embodiment, the above-mentioned relief pattern may be created by any known technique, e.g., photolithography (various wavelengths including G line, I line, 248 nm, 193 nm, 157 nm, and 13.2-13.4 nm), contact lithography, e-beam lithography, x-ray lithography, ion-beam lithography and atomic beam lithography. For example, the above-mentioned relief pattern may be created using techniques described in U.S. Pat. No. 5,772,905, which is hereby incorporated by reference.

Nano-structures with varying geometric cross-sections may be fabricated using techniques described herein. Generally, this process may include two phases. In Phase 1, a combination of multiple lithographic steps may be used to create an imprint template with shaped cross-sections (referred to here as nano-shaped templates). The multiple lithographic steps may use one or more kinds of lithography processes such as electron beam, imprint lithography or photolithography. In Phase 2, the nano-shaped template may be used in conjunction with an imprint lithography process to obtain a high-speed approach for replicating the nano-shapes.

Phase 1: Formation of Nano-Shaped Template

Generally, Phase 1 may comprise multiple process steps. For simplification in description, the formation of the nano-shaped template is described herein using imprint lithography. However, it should be noted that the patterning steps may use photolithography, electron beam lithography, and the like.

Generally, a thin layer of first material (e.g., non-wet strippable material), including polymers, dielectrics, metals, etc., may be deposited on a desired substrate made of a nano structure material. A layer of second resist (e.g., wet strippable material) may be deposited over the first material. The second resist may be selectively wet-stripped with the first material substantially remaining intact. A formable imprint lithography material may be deposited over the second resist material and the lithography material may be imprinted to form a relief pattern. The mold used to create the relief pattern using imprinting may be comprised of simple geometries formable from an e-beam process (e.g., lines, dots, holes, and the like). An optional adhesion material may be deposited between the second resist material and the third formable material to facilitate adhesion of the formable material to the underlying substrate. Adhesive layer may be formed of adhesion materials as further described in U.S. Publication No. 2007/0212494, which is hereby incorporated by reference. The relief pattern in the formable layer may be optionally etched to produce raised patterns of formable material, wherein the raised patterns have a smaller size as compared to the size prior to the etch.

An overcoat material may be deposited over the etched formable layer. Overcoat material may be blanket etched to expose a top surface of the thin raised lines. The exposed formable material may be etched to form trenches extending down to the non wet strippable first resist material. Non-wet strippable resist may be dry etched stopping when the substrate is reached. The formable layer material and the wet strippable material may be stripped leaving the non-wet strippable material with trenches extending down to the substrate. The substrate may be etched down to a desired depth if a pattern in the surface is final. Finally, the imprint mold may be modified in form and/or orientation and the process is repeated from step 2 if the pattern in the surface is not final.

Figure 2A:
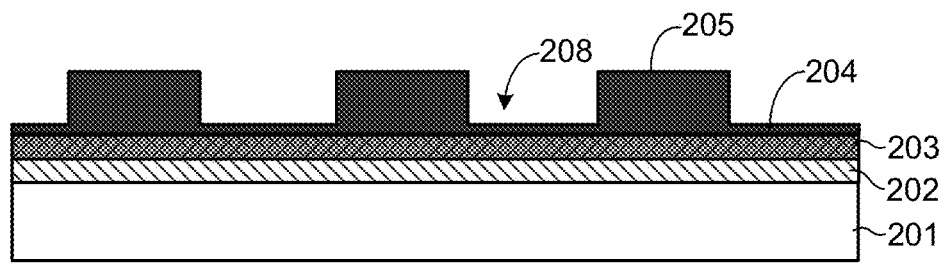
FIGS. 2A-2C illustrate cross-section views showing material layers after processing according to embodiments herein.

FIGS. 2A-4B illustrate an exemplary formation of a nano-shaped template having nano-patterned structures. FIG. 2A illustrates a cross-section view of a substrate 201 with resist layer 202 (e.g., a non-wet strippable) and resist layer 203 (e.g., a wet strippable) disposed over layer 202. A formable material 204 may be deposited over the two resist layers and imprinted to form exemplary features (e.g., lines) 205 with spaces 208, that may be of equal dimensions using system and methods described in relation to FIG. 1.

Figure 2B:
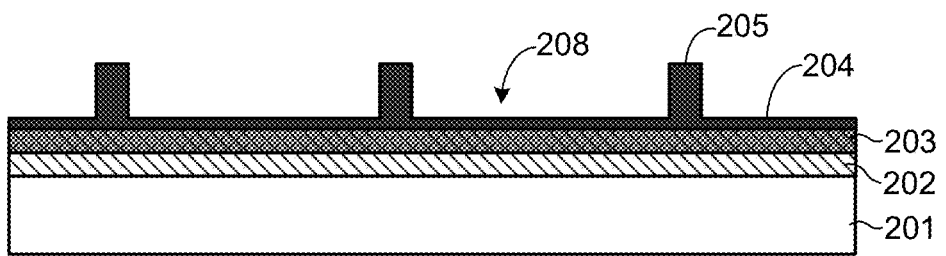

FIG. 2B illustrates a cross-section view of the multiplayer structure of FIG. 2A after the formable material 204 has been etched thereby thinning features 205 to form features that have a high aspect ratio of height to width. Substrate 201, resist layer 202 and resist layer 203 are also visible in this view.

Figure 2C:
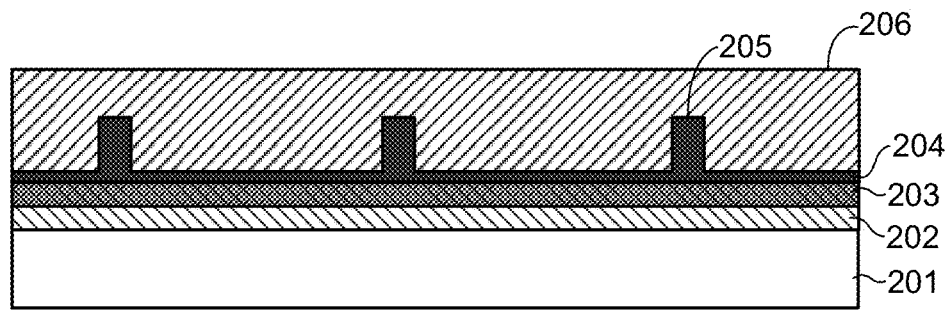

FIG. 2C illustrates a cross-section view of the multi-layer structure of FIG. 2B after an overcoat layer 206 has been applied over the surface to a height above the features 205. This overcoat layer may be a silicon-containing polymer similar to the disclosure in the U.S. Pat. No. 7,186,656, which is hereby incorporated by reference. Substrate 201, resist layer 202, and resist layer 203 are again visible in this view.

Figure 3A:
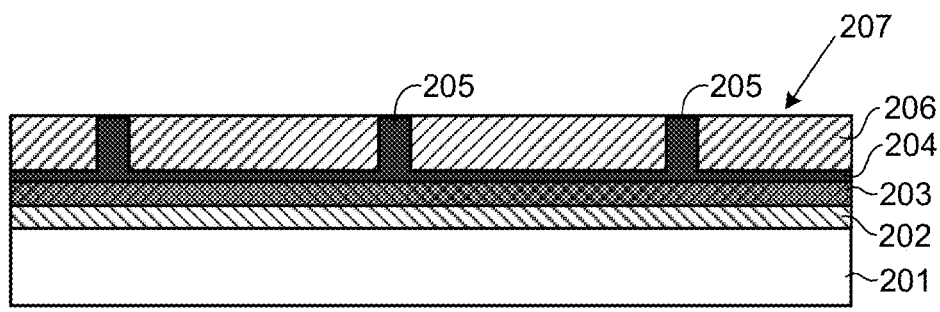
FIGS. 3A-3C illustrate cross-section views showing material layers after further processing according to embodiments herein.

FIG. 3A illustrates a cross-section view of the structure of FIG. 2C after overcoat layer 206 has been planarized to expose the tops of the features 205 above surface 207. Substrate 201, resist layer 202, resist layer 203, and overcoat layer 206 are visible in this view.

Figure 3B:
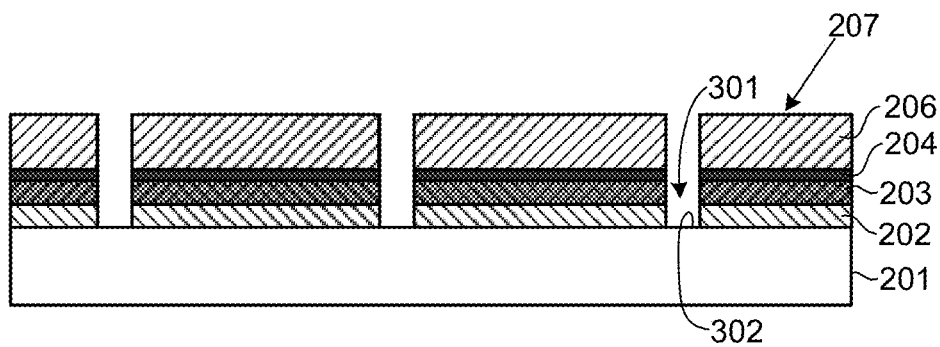

FIG. 3B illustrates a cross-section view of the structure of FIG. 3A after the formable material 204 has been etched through to resist layer 203. Further, non-wet etching (e.g., with $O_2$) removes resist layer 202 in the trenches stopping at substrate 201. Substrate 201, resist layer 202, resist layer 203, formable layer 204, and overcoat layer 206 are visible in this view. Channel 301 may be formed when features 205 are etched. Further, removal of the layers 202-204 in channel 301 may extend channel depth 302 to a surface of substrate 201.

Figure 3C:
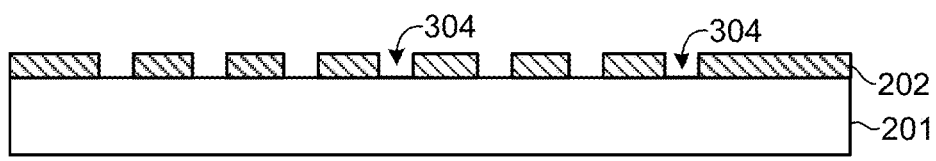

FIG. 3C illustrates a cross-section view of the structure in FIG. 3B after overcoat layer 206, formable material 204, and resist layer 203 have been stripped leaving only the resist layer 202 with grooves 304 to the substrate 201. Forming nano-patterns or surface features of a particular shape may be provided by repeating the process steps of FIG. 2A-FIG. 3C until a desired surface pattern corresponding to the desired nanostructure(s) has been achieved.

Figure 4A:
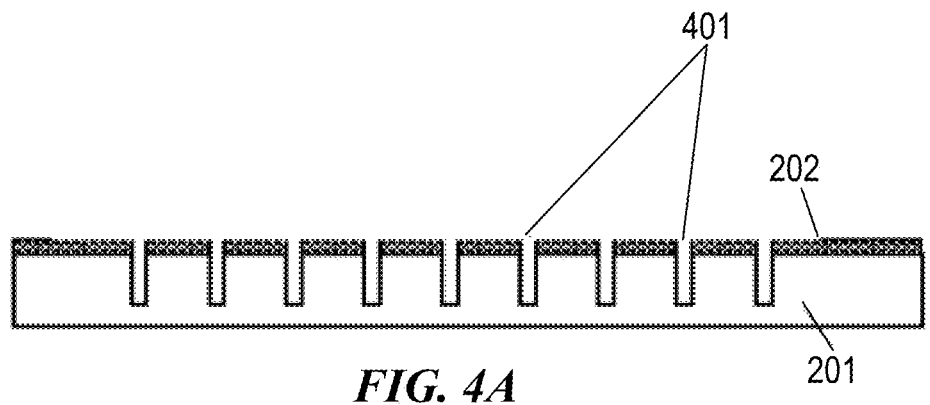
FIG. 4A illustrates a cross-section view showing trenches etched into the substrate according to embodiments herein.
Figure 4B:
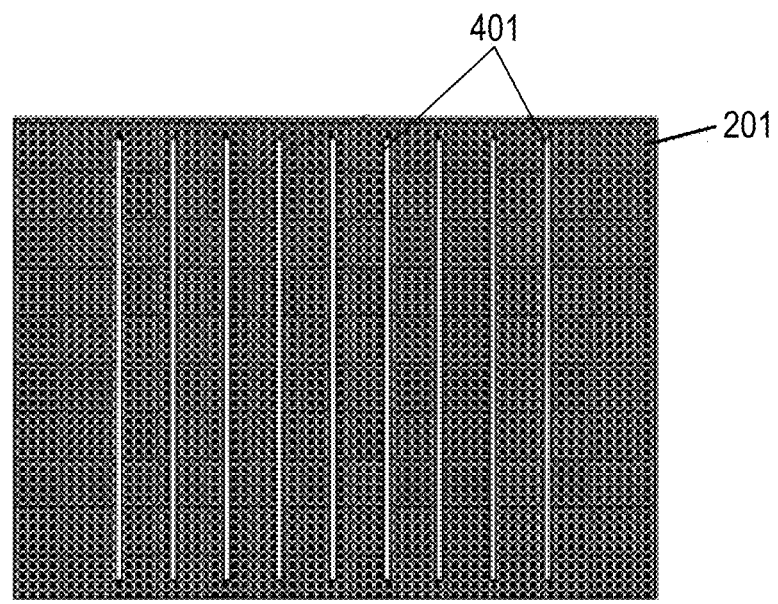
FIG. 4B illustrates a top view of the trenches of FIG. 4A.

FIG. 4A illustrates a cross-section view of the exemplary pattern of FIG. 3C etched to a particular depth forming grooves 401. Substrate 201 and resist layer 202 are visible in this view. FIG. 4B illustrates a top view of grooves 401 in substrate 201.

Figure 5A:
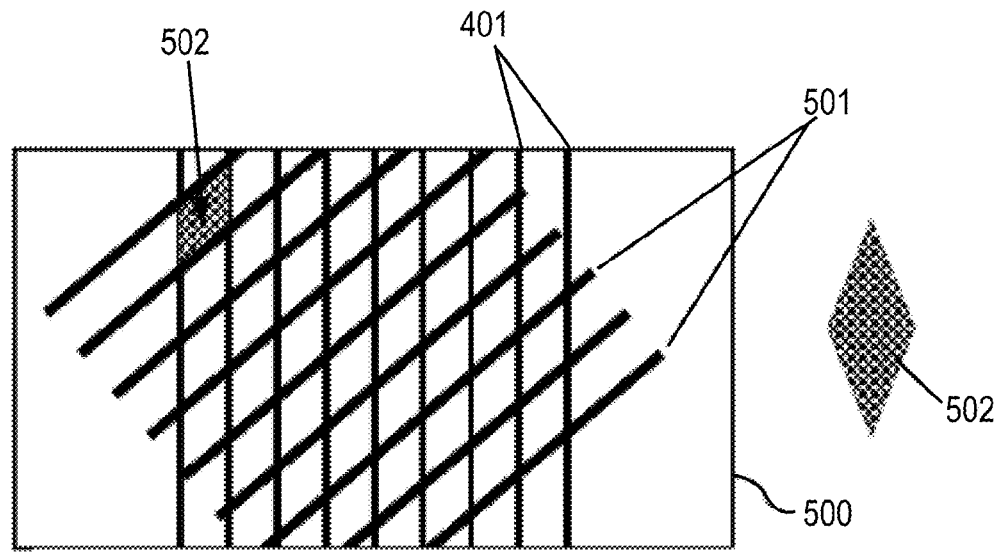
FIG. 5A illustrates a top view of an exemplary patterned surface having nano-structures formed by etching trenches formed by a first pattern and a second pattern.

FIG. 5A illustrates a top view of the substrate 201 after processing with a first pattern 501 using process steps of FIGS. 2A-4B. A rhombus shaped surface pattern 502 may thereby be formed using this process sequence. The trenches and surface pattern 502 may be used to increase the surface area of structure 500.

Figure 5B:
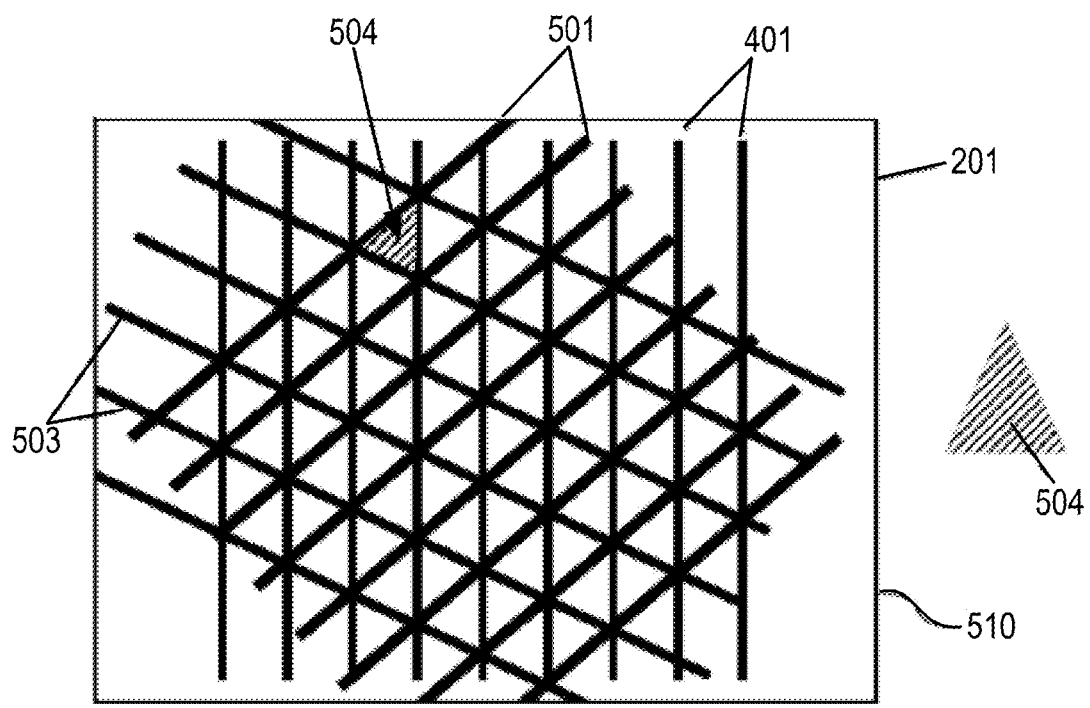
FIG. 5B illustrates a top view of another exemplary patterned surface having nano-structures formed by etching trenches formed by a first pattern and additional overlaying patterns.

FIG. 5B illustrates a top view of the substrate 201 after processing with an additional overlayed pattern 503 using process steps of FIGS. 2A-4B. A triangular shaped surface pattern 504 may thereby be formed using this process sequence. The trenches and the surface pattern 504 may be used to increase the surface area of structure 510. In another embodiment, the trenches are etched through thereby producing uniform nano-shaped patterns that have the triangular cross-section and a length corresponding to the substrate thickness.

Figure 6:
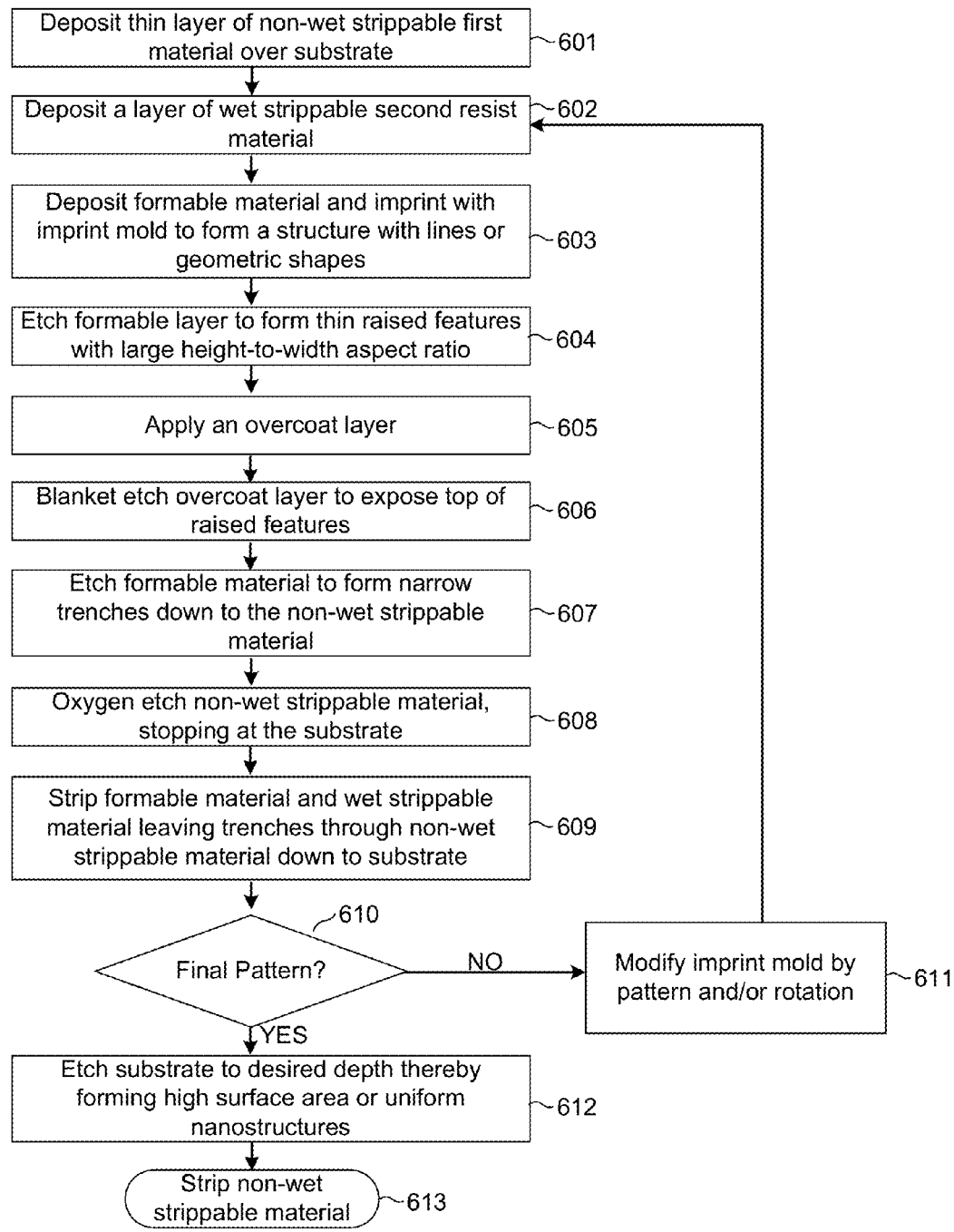
FIG. 6 illustrates a flow diagram of an exemplary for forming nanostructures according to embodiments herein.

FIG. 6 is a flow diagram of process steps for formation of an exemplary nano-shaped template having nano-shaped structures. In step 601, a thin layer of first resist may be deposited on a substrate. In step 602, an overlay of second resist may be deposited. For example, second resist may include a wet strippable material, a soluble material, such as PMGI (Polymethylglutarimide), and/or the like. PMGI may be wet-stripped by tetramethylammonium hydroxide (TMAH) that may be obtained under the trade name CD260 from Shipley Company, L.L.C. (now Rohm Haas). Alternatively, the second resist may be any negative photoresist, for example poly hydroxyl styrene. Each resist layer may include an intermediate layer for adhesion purposes such as the material disclosed in U.S. Publication No. 2007/0212494. In step 603, a layer of formable material may be deposited and imprinted with an imprint mold to form a third resist layer that has relief patterns of raised patterns separated by depressions as spaces. In one embodiment, the width of the raised patterns and spaces are equal. In step 604, the relief pattern may be etched forming smaller raised patterns with a large height to width ratio. In step 605, an overcoat of silicon-containing organic material may be applied to cover the raised lines. In one embodiment, overcoat layer may be a silicon-containing polymer similar to the disclosure in the U.S. Pat. No. 7,186, 656. In step 606, a blanket etch may expose the top surface of the raised lines. In step 607, the formable material may be etched to form trenches down to the first resist material, which responds to a different etch chemistry. In step 608, the first resist material may be dry etched (e.g., with oxygen) stopping at the substrate. In step 609, the formable material and the second resist may be stripped leaving trenches through the first resist down to the substrate. In step 610, a decision may be made if the pattern formed in the surface of the substrate is the final pattern. If the decision is NO, then in step 611, the imprint mold may be modified either by an overlaying pattern, alterations to the current pattern, and/or rotation of an existing pattern. For example, a branch may be taken back to step 602 wherein some of the process steps may be repeated forming a second pattern overlaying the first pattern in the substrate. If the decision in step 610 is YES, then in step 612, the substrate may be etched through the patterned first resist layer to a desired depth thereby forming a shaped nanostructure on the substrate. In step 613, the first resist material may be stripped away.

In another embodiment, FIG. 6 may involve using a metal film (such as chromium). For example, the metal film may be included in Step 601. Step 602 may be eliminated. Steps 604-608 may be as is in FIG. 6. However, step 609 may be replaced by a halogen and $O_2$ plasma ashing processes to remove all the organic materials leaving behind the etched pattern in the metal film. This process may be repeated as many times as needed to create nano-shapes. Additionally, an optional adhesion layer (described earlier) may be used just prior to the imprinting step in Step 603.

In another embodiment of the process of FIG. 6, Steps 604-606 may be eliminated and the formable imprinted material of Step 603 may be directly etched into materials put down in earlier steps (whether it is a wet strippable second material and a non-wet strippable first material or a metal film such as chromium used without the wet strippable material). This embodiment leads to patterns that have the opposite tone of the patterns obtained in the process steps 603-606 in FIG. 6.

In another embodiment of the process of FIG. 6, Steps 601 and 602 may be eliminated and a metal film (e.g., chromium) may be deposited on the substrate. Formable material of Step 603 may be imprinted and etched, however, the pattern may be etched directly into the substrate. Steps 605-608 may be eliminated and formable material stripped leaving trenches in the metal film and the substrate. The process may then be repeated as many times as needed to create nano-shapes.

The FIGS. 2-5 illustrate process steps that result in a substrate with shaped nano-structures which are valuable in many applications. Nano-structures other than those shown may be produced by the method described herein and are considered within the scope of the present invention. Additionally, elements of process systems and methods disclosed in U.S. Pat. Nos. 7,186,656, 7,252,777, and 7,261,831, may be used to aid in formation of nano-structures, all of which are hereby incorporated by reference in their entirety.

Figure 11A:
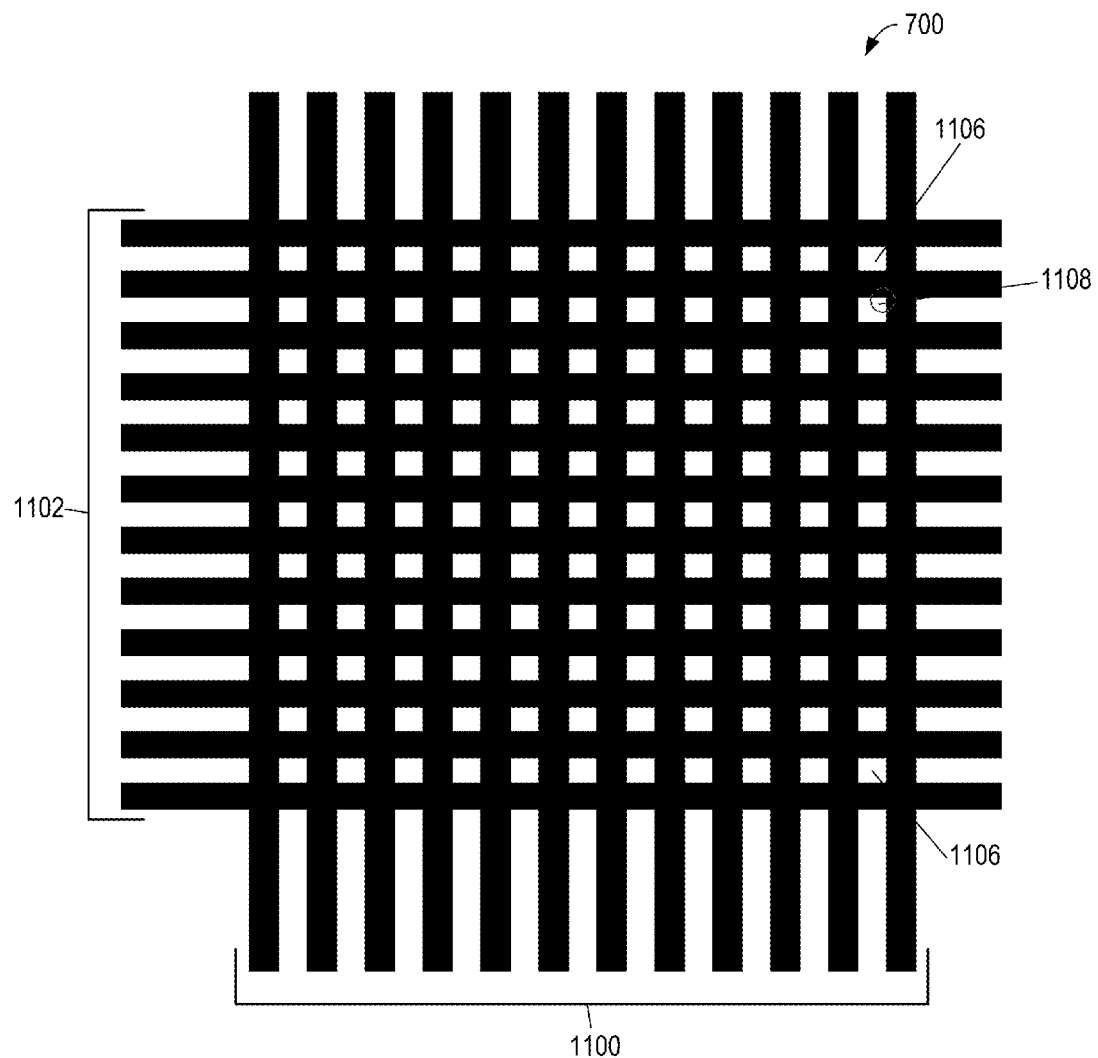
FIG. 11A illustrates a top down view of an exemplary rectangular column formed by using a first pattern and an overlaying pattern.
Figure 11B:
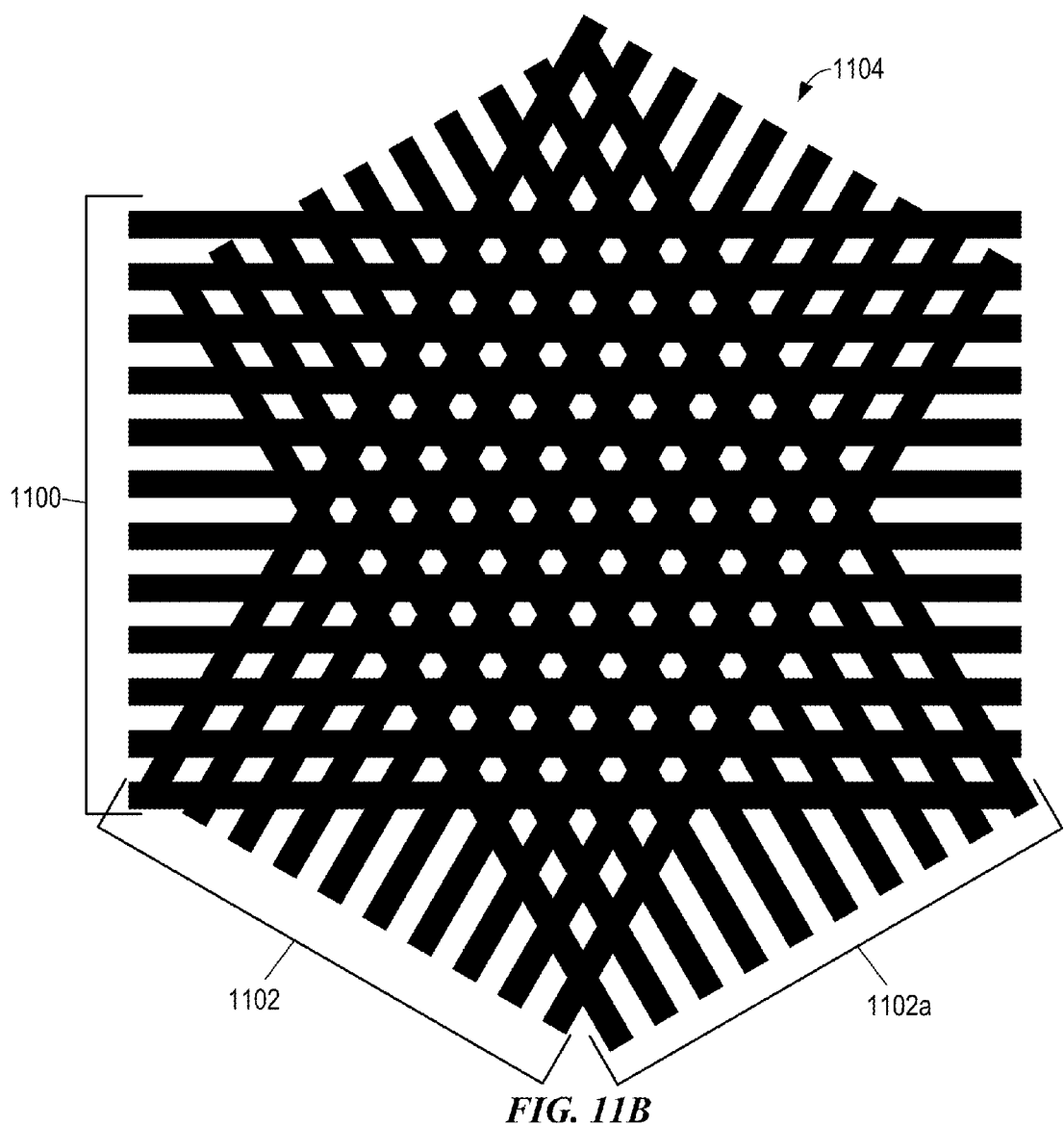
FIG. 11B illustrates a top down view of an exemplary hexagonal column formed by using a first pattern and overlaying patterns.

Exemplary nano-structures are illustrated in FIGS. 11-12. For example, FIGS. 11A and 11B illustrate shapes such as rectangles, squares, and hexagons that may be created. It should be noted that other shape may be formed including, but not limited to triangles, and any other fanciful shape. In FIG. 11A, a first pattern 1100 may be overlayed by a second pattern 1102 providing a surface pattern 1104 having a plurality of nanoshapes 1106 having at least one sharp edge 1108. In FIG.

11B, first pattern 1100a may be overlayed by second pattern 1102 and additional pattern 1102a.

In some embodiments, the second pattern 1102 and/or additional patterns may be substantially similar to first pattern 1100, for example, a rotation of the pattern. Alternatively, the second pattern 1102 and/or additional patterns may be substantial different than first pattern 1100. For example, FIG. 12A illustrates first pattern 1100 and FIG. 12B illustrates second pattern 1102. As shown in FIG. 12C, overlay of first pattern 110 and second pattern 1102 may provide surface pattern 1104 having a plurality of nanoshapes 1106 having at least one sharp edge 1108.

The above detailed description describes a process where nano-patterns for a final product or for fabricating an imprint mold may be realized. For certain nano-patterns, it may not be practical to directly create a mold using a typical e-beam process. In this case, the disclosed process may be used to create a first imprint mold that has desired nano-patterns with desired sharp corners or edges. This first imprint mold may then be used to repeatedly pattern a new substrate to create more complex nano-patterns, again with the desired sharp corners or edges. Once the desired complex nano-patterns are achieved on the new substrate, it in turn may be used in a step and repeat process to fabricate a large area imprint mold that now is able to produce the complex nano-pattern for production that is both fast and cost effective.

Phase 2: Nano-Pattern Structure Replication

FIGS. 7-10 illustrate side views of exemplary formation of nano-pattern structures 702. Generally, polymerizable material 34 may be deposited on the surface 706 of a substrate 708 and contacted by a nano-pattern mold 700 to form the nano-pattern structures 702 using the imprint lithography process described herein in relation to FIG. 1. The nano-pattern structures 702 may include a residual layer 712 and features (e.g. protrusions 720 and/or recessions 722) having at least one sharp edge. Residual layer 712 may have a thickness $t_R$. A thin residual layer 712 may reduce the occurrence of rounded features (e.g. protrusions 720) during subsequent processing of nano-pattern structures 702. For example, residual layer 712 may have a thickness $t_R$ of 1-25 nm to reduce the occurrence of rounded features.

The residual layer thickness $t_R$ may be controlled by the volume of polymerizable material 34, surface energy, and/or the like. The description below outlines methods for controlling residual layer thickness $t_R$ to reduce and/or eliminate occurrence of rounded features and provide sharp edges.

Volume Control

The selection for the volume of polymerizable material 34 may be determined by three features: 1) drop volume, 2) drop spreading, and 3) template volume.

Polymerizable material 34 may be a low viscosity polymerizable imprint solution having a pre-determined drop volume. Drop volume of polymerizable material 34 may be selected based on how far drops spread before contact between the nano-pattern mold 700 and substrate 708 due to high capillary forces at the perimeter of the drop. For example, polymerizable material 34 may have a drop volume of 0.5-50 cps.

Drop spread is generally a function of the drop volume, volume of nano-pattern mold 700, surface energy of nano-pattern mold 700 and/or surface energy of substrate 708. For example, for a blank nano-pattern mold 700, a 6 pl drop volume may provide a drop spread of approximately seven times the dispensed diameter of the drop. This drop volume may further result in the residual layer 712 having a range of between 10 and 15 nm.

Generally, the residual layer may further be defined by the excess polymerizable material 34 above the volume of the nano-patterned mold 700 within the area that the drop will spread over a given time. In some cases, the volume of polymerizable material 34 per drop spread area may be significantly large compared to the volume of nano-patterned mold 700. This may result in a thick residual layer 712, e.g. >5 nm.

The surface energies enable the polymerizable material 34 to wet the nano-patterned mold 700 and surface 706 of the substrate 708 such that the polymerizable material 34 may be transported over large distances well in excess of the initial drop size, i.e. <100 um diameter. Fluid movement once the nano-patterned mold 700 contacts the polymerizable material 34 may be driven by capillary action and the contact geometry between the nano-patterned mold 700 and substrate 708. For example, drops may expand up to 6 or 7 times their drop diameter to form a uniform film. However, it is important there is not a great excess of monomer above the template volume, or the residual layer thickness will be >5 nm.

Dummy Volume Fill Features

Dummy volume fill features may be introduced in certain nano-patterned mold 700 regions to "soak" up the excess polymerizable material 34. The need for such structures may be determined by the following equation. If the nano-patterned mold 700 feature volume is small compared to the local drop volume, dummy fill may be required for <5 nm residual layer thickness $t_R$.

Definition of Variables
r=the drop radius
ri=as-dispensed drop radius
is =drop spreading time
t=time
Vd=as-dispensed drop volume
Vf=template feature volume
df=template feature depth
v=template duty cycle in the case of a grating
af=area occupied by features
RLT=residual layer thickness
ad=drop spread area Residual layer thickness $t_R$ over the area where a drop spreads for a grating structure is defined by:

$$ad=[ri+(dr/dt)*ts]^2*v$$

$$Vf=af*df/v \text{ for the case of a grating structure}$$

$$RLT=[Vd-(af*df/v)]/\{[ri+(dr/dt)*ts]^2*v\}$$

If the residual layer thickness $t_R$ is positive and >5 nm, then dummy fill may be required such that Vf is on the order of the drop volume for a given spread area. If the residual layer thickness $t_R$ is negative, then additional polymerizable material may be added.

If the feature area is too small or etch depth too shallow for a given drop spread area, dummy fill may be required to consume the excess volume within the drop spread area. The drop spread area is a function of the feature area and depth and can limit the spread of a drop as the volume of the polymerizable material 34 is consumed.

Surface Energy

The area over which the drop will spread may be a function of the surface energies between polymerizable material 34, nano-patterned mold 700 and substrate 708, the viscosity of the polymerizable material 34, and/or capillary forces. If the capillary forces are high, spreading may occur fast and as such may require low viscosity fluids and a thin film within the drop area.

To enable efficient fluid spreading and feature filling, the contact angles of the polymerizable material 34 with the nano-patterned mold 708 and/or substrate 708 may be controlled. The contact angles may be managed by applying Transpin™ or ValMat™ adhesion promoters to the substrate 708, and through the use of surfactants in the polymerizable material 34 that may coat the nano-patterned mold 700. As such, the contact angle of the polymerizable material 34 with the nano-patterned mold 700 may be about <500, while the contact angle of the polymerizable material 34 with the substrate 708 may be about <150. The contact angles as a measure of surface energies may enable the features of the nano-patterned mold 700 to readily fill the nano-patterned mold 700 and the polymerizable material 34 to readily spread large distances over the substrate 708. Long distance spreading may be controlled by surface energies, viscosity and capillary forces. The ability to control surface energies may enable the monomer to spread over large distances.

Formation of Nano-Shaped Structures

Figure 7A:
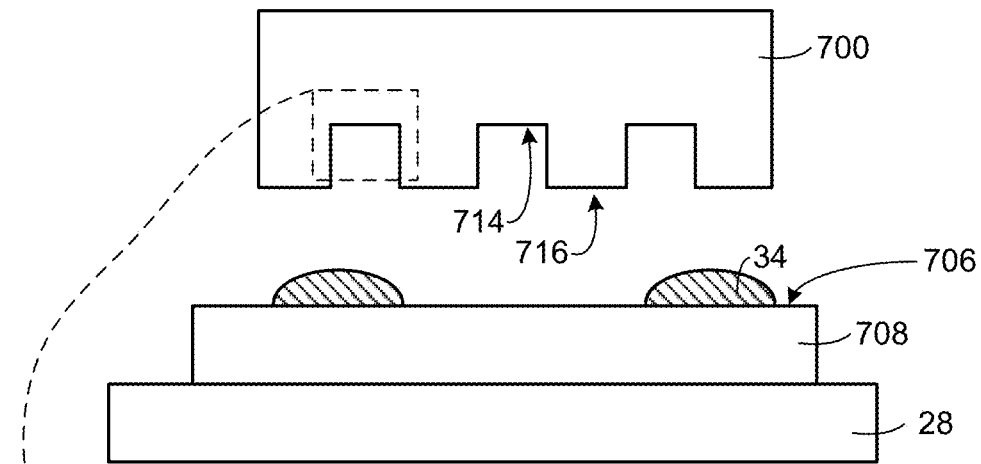
FIG. 7A illustrates a simplified cross-sectional view of a nano-pattern mold positioned above a substrate.
Figure 7B:
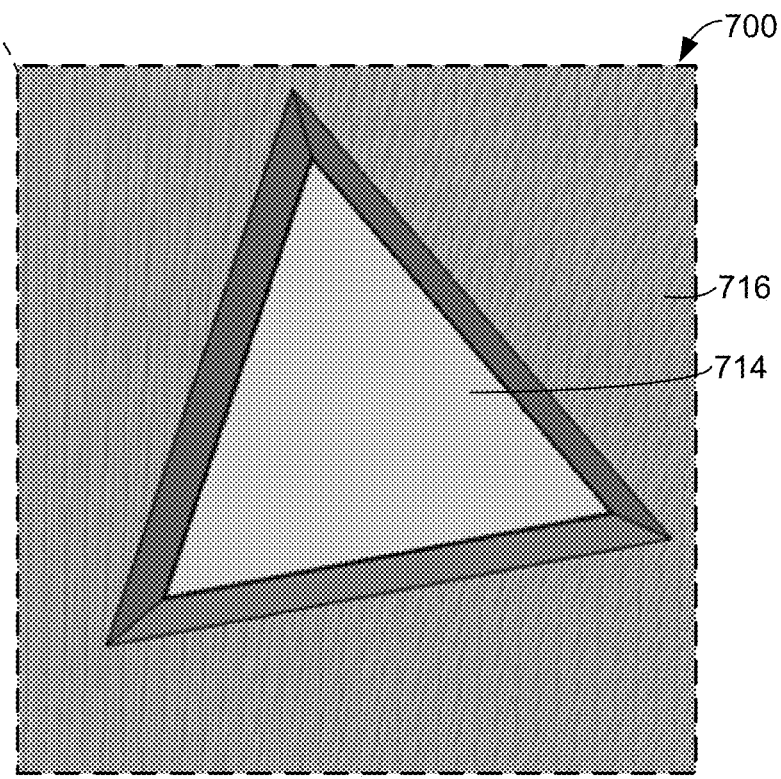
FIG. 7B illustrates a top down magnified view of a recession of the nano-pattern mold in FIG. 7A.

FIGS. 7A and 7B illustrate nano-pattern mold 700 positioned above substrate 708 having polymerizable material 34 deposited thereon. Nano-pattern mold 700 may have features (e.g., recessions 714 and/or protrusions 716). Recessions 714 and/or protrusions 716 may be formed having sharp edges using the process described herein. For example, nano-pattern mold 700 may be formed having recessions 714 in a triangular shape as illustrate in FIG. 7B. Although a triangular shape is illustrated, it should be noted that any shape having sharp edges and features may be formed including, but not limited to, rectangular, hexagonal, or any other fanciful shape.

Figure 8:
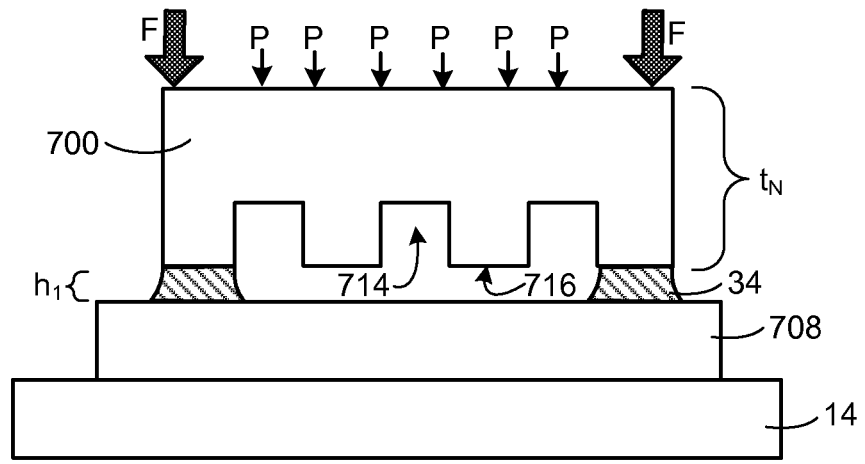
FIG. 8 illustrates a simplified cross-sectional view of a nano-pattern mold positioned above a substrate at a first height.
Figure 9:
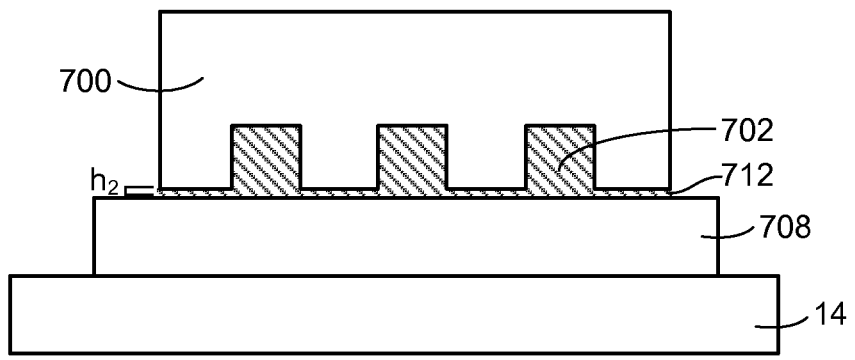
FIG. 9 illustrates a simplified cross-sectional view of a nano-pattern mold positioned above a substrate at a second height.

FIGS. 8-9 illustrate the spread of polymerizable material 34 as nano-pattern mold 700 positioned at a height $h_1$ (FIG. 8) moves to height $h_2$ (FIG. 9). Nano-pattern mold 700 may have a thickness $t_N$. For example, nano-pattern mold 700 may have a thickness of 0.5 mm-10 mm.

The spreading of polymerizable material 34 during movement of the nano-pattern mold 700 from height $h_1$ to height $h_2$ is generally capillary driven with some additional applied forces. For example, an amount of force F may be provided by imprint head 38 (shown in FIG. 1) on nano-pattern mold 700 to position nano-pattern mold 700 at height h above substrate 708. The force F, however, may be minimal (e.g. 0-10 N). Additionally, chuck 28 (shown in FIG. 1) may apply pressure P. Pressure P may also be just enough to provide suitable positioning of nano-pattern mold 700 without substantial bowing or other substantial deformations. For example, pressure P may be approximately 0-0.1 atm. Minimal applied forces (e.g., force F and pressure P) may reduce deformation of the residual layer 712. Additionally, it should be noted, that chuck 14 may provide minimal force to substrate 12 to reduce deformation of residual layer 712 during formation and separation of nano-pattern structure 702.

Figure 10:
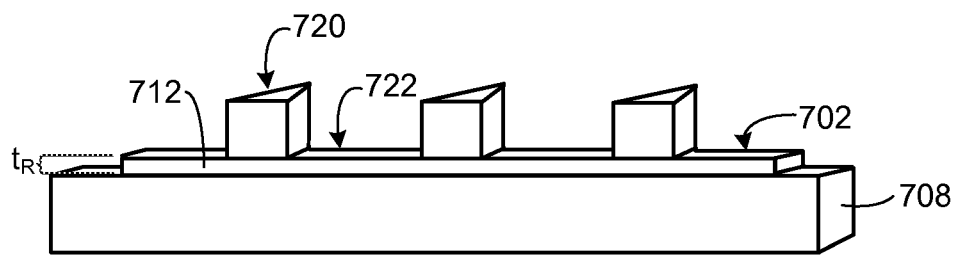
FIG. 10 illustrates a simplified perspective view of a nano-pattern structure formed on a substrate.

FIG. 10 illustrates the formed nano-pattern structure 702 with residual layer 712 having thickness $t_R$ and protrusions 720 having sharp edges. It should be noted that with such thin residual layers, and the fact that adhesion layers may be 1 nm thick, pattern transfer that begins with the substrate etch and no descum is enabled. To this end, an imprint pattern transfer manufacturing process may include: Vapor coat adhesion layer (1 nm thick), drop on demand resist dispense (dispense pattern and monomer volume is based on template volume calculation), imprint patterning (dummy fill if needed) with <5 nm RLT, substrate only etch (no descum), strip and clean substrate. It should be noted that if a descum etch is needed, it may be for removing a thin residual film, and as such may not impact the shape of the shaped nano-structures substantially. This may allow for etching of the substrate while retaining the nano-shapes present in the mold. This is in contrast to conventional imprint lithography wherein the following steps are taken: Vapor coat adhesion layer (1 nm thick), spin on imprint material, imprint patterning>5 nm RLT, substantial imprint resist descum (by $O_2$ plasma), substrate etch, strip and clean substrate.

Embodiments of the present invention described above are exemplary. Many changes and modifications may be made to the disclosure recited above while remaining within the scope of the invention. Therefore, the scope of the invention should not be limited by the above description, but instead should be determined with reference to any appended claims along with their full scope of equivalents.

What is claimed is:

1. A method of forming an imprint lithography template, comprising:
    forming a first pattern of grooves in a first layer formed of a non-wet strippable resist material positioned on a substrate, wherein forming the first pattern includes:
        depositing a second layer of wet strippable resist on the first layer;
        depositing formable material on the second layer;
        imprinting the formable material using a nano-imprint lithography template to form a third layer of resist having a first patterned layer, the first patterned layer including a plurality of raised portion separated by depressions;
        etching the third layer such that a ratio of height to width of the raised portions substantially increases;
        depositing an overcoat layer on the third layer and planarizing the overcoat layer exposing an edge of each raised portion;
        etching the third layer to form one or more trenches in the second layer and the first layer; and,
        removing the second layer and the third layer;
    forming a second pattern of grooves in a second layer overlaying the first pattern in the first layer, the second pattern of grooves oriented at an angle relative to the first pattern of grooves; and,
    etching the first pattern and the second pattern into the substrate forming a nano-shaped imprint lithography template having a surface imprinting pattern, the surface imprinting pattern including a plurality of features having at least one sharp edge defined by the intersection of the first and second pattern of grooves.

2. The method of claim 1, wherein the second layer is formed of a soluble material.

3. The method of claim 2, wherein the second layer includes polymethylglutarimide.

4. The method of claim 1, wherein the second layer is formed of a negative photoresist.

5. The method of claim 4, wherein the second layer includes poly hydroxyl styrene.

6. The method of claim 1, wherein the second layer includes an intermediate layer, the intermediate layer having adhesive properties.

7. The method of claim 1, wherein width of the raised portions are substantially similar to width of the depressions prior to etching of the third layer.

8. The method of claim 1, wherein the overcoat layer includes a silicon containing polymer.

9. The method of claim 1, wherein etching the third layer to form one or more trenches in the second layer and the first layer further comprises dry etching the first layer.

10. A method, comprising:

forming a first pattern of grooves in a first layer formed of a non-wet strippable resist material positioned on a substrate, wherein forming the first pattern of grooves includes depositing a second layer of wet strippable resist on the first layer;

depositing formable material on the second layer;

imprinting the formable material using a nano-imprint lithography template to form a third layer of resist having a first patterned layer, the first patterned layer including a plurality of raised portion separated by depressions;

etching the third layer such that a ratio of height to width of the raised portions substantially increases;

depositing an overcoat layer on the third layer and planarizing the overcoat layer exposing an edge of each raised portion;

etching the third layer to form one or more trenches in the second layer and the first layer; and, removing the second layer and the third layer;

forming a second pattern overlaying the first pattern in the first layer; and, etching the first pattern and the second pattern into the substrate forming a nano-shaped imprint lithography template having a surface pattern, the surface pattern including a plurality of features having at least one sharp edge.

11. The method of claim 10, wherein the second layer is formed of a soluble material.

12. The method of claim 11, wherein the second layer includes polymethylglutarimide.

13. The method of claim 10, wherein the second layer is formed of a negative photoresist.

14. The method of claim 13, wherein the second layer includes poly hydroxyl styrene.

15. The method of claim 10, wherein width of the raised portions are substantially similar to width of the depressions prior to etching of the third layer.

16. The method of claim 10, wherein the overcoat layer includes a silicon containing polymer.

17. The method of claim 10, wherein etching the third layer to form one or more trenches in the second layer and the first layer further comprises dry etching the first layer.

18. A method, comprising:

forming a first pattern of grooves in a first layer of metal positioned on a substrate, wherein forming the first pattern of grooves includes depositing a second layer on the first layer, the second layer formed of wet strippable resist material;

depositing formable material on the second layer;

imprinting the formable material using a nano-imprint lithography template to form a third layer of resist having a first patterned layer, the first patterned layer including a plurality of raised portion separated by depressions;

etching the third layer such that a ratio of height to width of the raised portions substantially increases;

depositing an overcoat layer on the third layer and planarizing the overcoat layer exposing an edge of each raised portion;

etching the third layer to form one or more trenches in the second layer and the first layer; and, removing the second layer and the third layer;

forming a second pattern overlaying the first pattern in the first layer; and, etching the first pattern and the second pattern into the substrate forming a nano-shaped imprint lithography template having a surface pattern, the surface pattern including a plurality of features having at least one sharp edge.

* * * * *